United States Patent
Sung

[19]

[11] Patent Number: 6,110,796
[45] Date of Patent: Aug. 29, 2000

[54] METHOD OF IMPROVING JUNCTION LEAKAGE PROBLEM OF SHALLOW TRENCH ISOLATION BY COVERING SAID STI WITH AN INSULATING LAYER DURING SALICIDE PROCESS

[75] Inventor: Kuo-Tung Sung, Hsinchu, Taiwan

[73] Assignee: United Integrated Circuits Corp., Hsinchu, Taiwan

[21] Appl. No.: 09/268,883

[22] Filed: Mar. 16, 1999

[30] Foreign Application Priority Data

Jan. 27, 1999 [TW] Taiwan ................................ 88101193

[51] Int. Cl.⁷ .................... H01L 21/8238; H01L 21/336; H01L 21/76; H01L 21/44
[52] U.S. Cl. ...................... 438/424; 438/221; 438/296; 438/300; 438/426; 438/682; 438/683
[58] Field of Search .................................. 438/300, 424, 438/296, 682, 683, 426, 221

[56] References Cited

U.S. PATENT DOCUMENTS 5,405,806  4/1995  Pfiester et al. .
5,434,093  7/1995  Chau et al. .
5,561,078  10/1996  Tasaka .
5,780,348  7/1998  Lin et al. .
5,989,965  11/1999  Man et al. .

*Primary Examiner*—Richard Booth
*Assistant Examiner*—Ron Pompey
*Attorney, Agent, or Firm*—J.C. Patents; Jiawei Huang

[57] ABSTRACT

A method of improving junction leakage problem as STI and Salicide processes are performed is provided. The invention is to form a protective insulating layer over STI structure and the periphery of STI structure to prevent penetration of metal ions to eliminate junction leakage problem. First a silicon substrate is provided. A source/drain region and a STI structure are formed in the substrate. A sidewall recess is formed on the upper surface of the STI trench sidewall to expose the substrate. An insulating layer is formed on STI structure, the sidewall recess and the source/drain region. The insulating layer is patterned to cover STI structure and the periphery of STI structure by photolithography and etching processes. The preferred thickness of the insulating layer is thick enough to prevent penetration of metal ions formed during the Salicide process. A Salicide process is performed on the insulating layer and the conductive region.

11 Claims, 2 Drawing Sheets

METHOD OF IMPROVING JUNCTION LEAKAGE PROBLEM OF SHALLOW TRENCH ISOLATION BY COVERING SAID STI WITH AN INSULATING LAYER DURING SALICIDE PROCESS

CROSS-REFERENCE TO RELATED APPLICATION

This application claims the priority benefit of Taiwan application serial no. 88101193, filed Jan. 27, 1999, the full disclosure of which is incorporated herein by reference.

BACKGROUND OF THE INVENTION

1. Field of the Invention

The invention relates in general to a method of improving junction leakage problem of shallow trench isolation (STI) structure, and more particularly to a method of improving junction leakage problem as STI and self-aligned silicide (Salicide) processes are performed.

2. Description of the Related Art

Integrated circuits (IC) are composed of many devices and isolation structures formed between the devices. The isolation structures, such as STI structure or field oxide isolation structure, are used for preventing carriers moving between devices and reducing charge leakage problem. As IC devices are scaled down, STI is currently employed in manufacturing IC devices, particularly in sub-half micron semiconductor process, to avoid the topographical uncertanties caused in using the more conventional thick field oxide isolation. The conventional growth of thermal field oxide using a mask such as nitride creates an encroachment of the oxide into the active areas, this encroachment being referred to as the bird's beak effect.

When STI is used, it is common to use wet dip (or wet etching) for removing oxide. Trench sidewall of STI structure may accordingly exposed after wet oxide dip (or wet oxide etching) to result in recess effect on the upper surface of the trench sidewall, such as sidewall recess 16 as shown in FIG. 1. It is more serious for non-volatile products, such as flash memories, since the non-volatile products include many oxide layers. For example, there are at least tunnel oxide layer, silicon oxide/silicon nitride/silicon oxide (ONO) layer or several different gate oxide layers with different thickness formed in flash memories. Therefore, the wet oxide dip process will perform much more times during fabricating non-volatile products.

As IC devices are scaled down, STI and Salicide processes are usually combined to reduce the resistance of IC devices. Salicide process is used for reducing the resistance of conductive poly-silicon layer and wiring lines. The Salicide process comprises the steps of forming refractory metal layer on poly-silicon layer or silicon substrate, and performing thermal process to make the metal layer reacting with silicon to form metal silicide (salicide) on the poly-silicon layer or silicon substrate. Once Salicide process performing with STI process, salicide layer will form on the sidewall recess in the trench that is not enclosed by the junction. Such salicide layer will cause serious leakage problem.

SUMMARY OF THE INVENTION

It is an object of the invention to provide a method of improving junction leakage problem as STI and Salicide processes are performed.

It is another object of the invention to provide a method of improving junction leakage problem to eliminate salicide layer formed on sidewall (or sidewall recess) of a trench of STI structure.

A method of improving junction leakage problem as STI and self-aligned silicide (Salicide) processes are performed comprises the following steps. First a silicon substrate is provided. A conductive region (such as a source/drain region) and a STI structure are formed in the substrate, wherein the conductive region connects to STI structure, and a sidewall recess is formed between the conductive region and STI structure to expose the substrate. An insulating layer is formed on STI structure, the sidewall recess and the conductive region. The preferred insulating layer is silicon oxide. The preferred thickness of the insulating layer is about 400 angstroms, which is thick enough to prevent penetration of metal ions formed during the Salicide process. Then a photoresist layer is formed and patterned on the insulating layer to cover STI structure and the periphery of STI structure. An etching process is performed on the insulating layer using the photoresist layer as a mask. The photoresist layer is removed. A Salicide process is performed on the insulating layer and the conductive region.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

FIGS. 1 to 4 are cross-sectional views showing a process flow of performing STI and Salicide processes of the invention.

Figure 1:
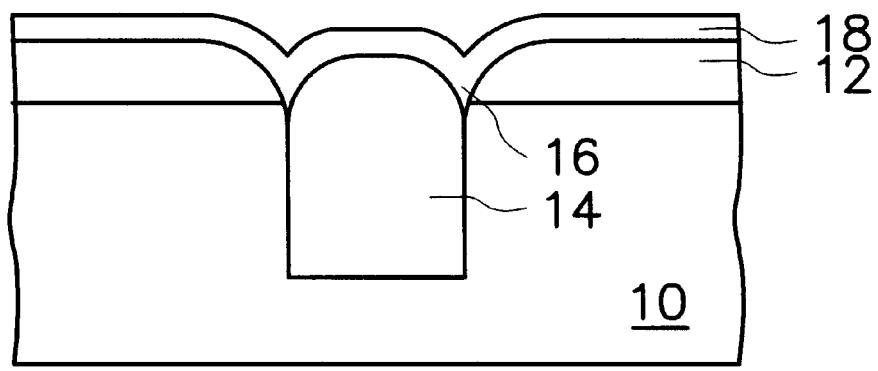
FIGS. 1 to 4 are cross-sectional views showing a process flow of performing STI and Salicide processes of the invention.

Referring to FIG. 1, a semiconductor substrate 10 is provided, such as silicon substrate. A MOS transister (not shown) and STI structure 14 are formed on the substrate 10. The MOS transister includes a gate (not shown) and a conductive region 12, such as a source/drain region formed in the substrate 10. The conductive region 12 connects to STI structure 14, and a sidewall recess 16 formed on the upper surface of the trench sidewall between the conductive region 12 and STI structure 14 to expose the substrate 10. The sidewall recess 16 is formed during forming STI structure 14 and the MOS transister. When forming STI structure 14 and the MOS transister, wet oxide dip (or wet oxide etching) is performed many times for removing different oxide layers. Trench sidewall of STI structure 14 may accordingly exposed after wet oxide dip (or wet oxide etching) to result in recess effect on the upper surface of the trench sidewall to form such as sidewall recess 16 as shown in FIG. 1.

A thin insulating layer 18 is formed on STI structure 14, the sidewall recess 16 and the conductive region 12. The method of forming the insulating layer 18 is preferably low pressure chemical vapor deposition (LPCVD) or sub-atmosphere pressure chemical vapor deposition (SACVD) using tetra-ethyl-ortho-siloxane (TEOS) as a source gas. The preferred material of the insulating layer 18 is silicon oxide, and the preferred thickness of the insulating layer 18 is about 400 angstroms. The thickness of the insulating layer is preferably thick enough to prevent penetration of metal ions formed during the following Salicide process or metalization process.

Figure 2:
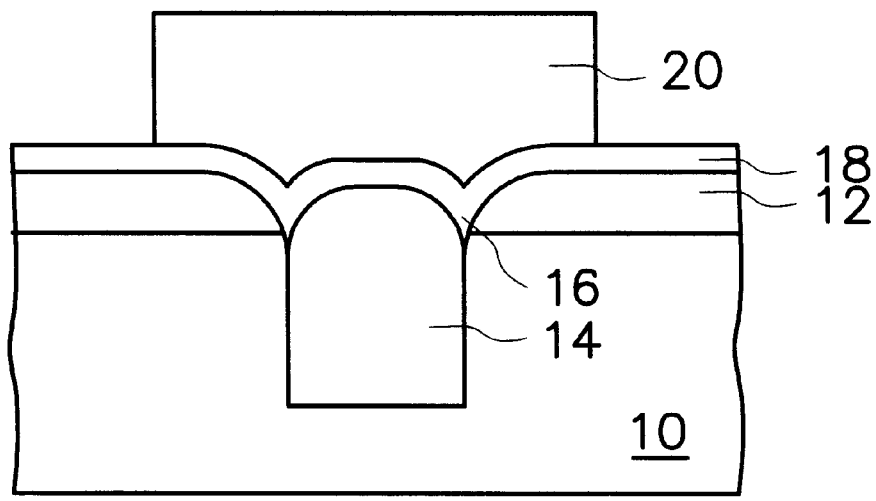

Referring next to FIG. 2, a photolithography process is performed on the insulating layer 18. A photoresist layer 20 is formed and patterned on the insulating layer 18 to cover STI structure 14 and the periphery of STI structure 14. That is, the photoresist layer 20 is patterned by exposing, developing and etching to cover STI structure 14 and part of the conductive region 12 which is located on the periphery of STI structure, as shown in FIG. 2.

Figure 3:
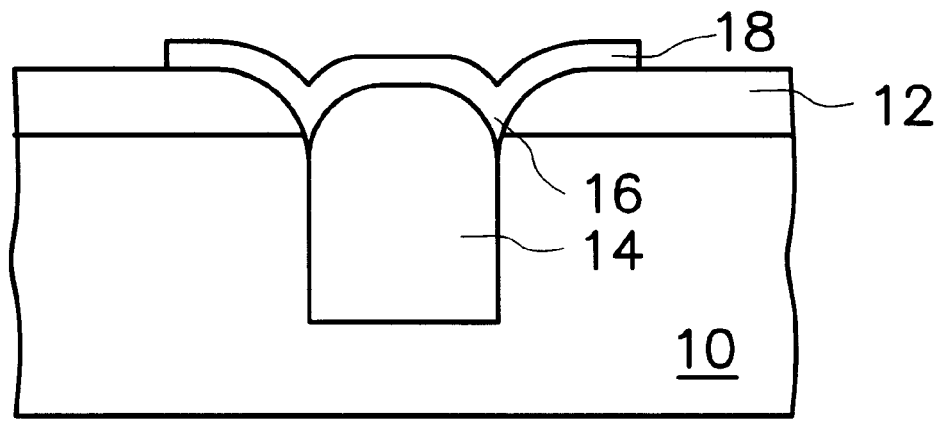

Referring to FIG. 3, an anisotropic etching process is performed on the insulating layer 18 using the photoresist layer 20 as a mask, until the surface of the conductive region 12 is exposed. Then the photoresist layer 20 is removed.

Figure 4:
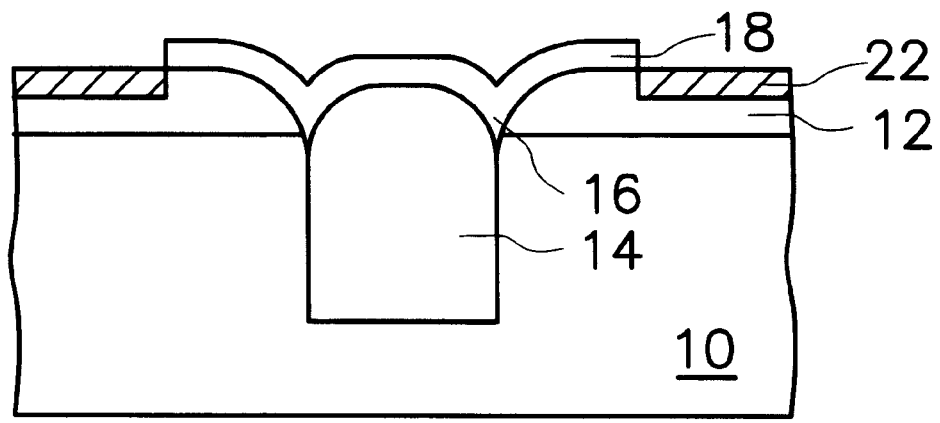

Referring to FIG. 4, a Salicide process is performed on the insulating layer 18 and the conductive region 12 to form a metal silicide (salicide) layer 22 is on the conductive region 12 and the gate of the MOS transister (not shown). The method of forming the metal silicide (salicide) layer 22 includes the steps of forming a refractory metal layer, performing thermal process to make the metal layer reacting with silicon which is located below the metal layer, and removing the remained metal layer not reacting with silicon. The preferred metal layer is titanium (Ti). As there is only silicon on the conductive region 12 and the gate of the MOS transister (not shown), the salicide layer 22 is accordingly formed on the conductive region 12 and the gate of the MOS transister (not shown) but not formed on the insulating layer 18. Therefore, the salicide layer 22 is not formed on the sidewall recess 16, and the sidewall recess 16 is protected to eliminate junction leakage problem.

While the invention has been described by way of example and in terms of preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications, similar arrangements and procedures.

What is claimed is:

1. A method of improving junction leakage problem as STI and Salicide processes are performed, wherein a conductive region and a STI structure are formed in a substrate, the conductive region connects to STI structure, and there is a sidewall recess formed between the conductive region and STI structure to expose the substrate, comprising the steps of:

forming an insulating layer on the STI structure, the sidewall recess and the conductive region;

forming a photoresist layer on the insulating layer, the photoresist layer covering the STI structure and the periphery of the STI structure;

performing an etching process on the insulating layer using the photoresist layer as a mask;

removing the photoresist layer; and performing a Salicide process on the insulating layer and the conductive region.

2. A method as claimed in claim 1, wherein the conductive region includes a source/drain region.

3. A method as claimed in claim 1, wherein the insulating layer includes silicon oxide.

4. A method as claimed in claim 1, wherein the thickness of the insulating layer is thick enough to prevent penetration of metal ions formed during the Salicide process.

5. A method as claimed in claim 1, wherein the thickness of the insulating layer is about 400 angstroms.

6. A method of improving STI junction leakage problem, comprising the steps of:

providing a substrate, wherein a conductive region and a STI structure are formed in the substrate, the conductive region connects to the STI structure, and there is a sidewall recess formed between the conductive region and the STI structure to expose the substrate; and forming an insulating layer on the STI structure, the sidewall recess and the periphery of the STI structure.

7. A method as claimed in claim 6, wherein the method of forming the insulating layer comprising:

depositing an insulating layer on the STI structure, the sidewall recess and the conductive region;

forming a photoresist layer on the insulating layer, the photoresist layer covering the STI structure and the periphery of the STI structure;

patterning the insulating layer by etching using the photoresist layer as a mask; and removing the photoresist layer.

8. A method as claimed in claim 6, wherein the conductive region includes a source/drain region.

9. A method as claimed in claim 6, wherein the insulating layer includes silicon oxide.

10. A method as claimed in claim 6, wherein the thickness of the insulating layer is about 400 angstroms.

11. A method as claimed in claim 6, wherein the thickness of the insulating layer is thick enough to prevent penetration of metal ions formed during following metalization process.

* * * * *